United States Patent
Kuo

(10) Patent No.: US 7,460,049 B2
(45) Date of Patent: Dec. 2, 2008

(54) POWER-TO-DIGITAL CONVERTER

(75) Inventor: Bing-Jye Kuo, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/734,897

(22) Filed: Apr. 13, 2007

(65) Prior Publication Data

US 2008/0252506 A1    Oct. 16, 2008

(51) Int. Cl.
H03M 1/12    (2006.01)

(52) U.S. Cl. .................. 341/156; 341/155; 341/142; 341/139

(58) Field of Classification Search .......... 341/155, 341/156, 118, 120, 139, 131; 455/115, 63, 455/67.1, 522
See application file for complete search history.

(56) References Cited

U.S. PATENT DOCUMENTS

| | | | | |
|---|---|---|---|---|
| 5,564,084 A * | 10/1996 | Hirasawa | .................. | 455/115.4 |
| 5,684,480 A   | 11/1997 | Jansson | | |
| 5,712,593 A * | 1/1998  | Buer et al. | .................. | 330/129 |
| 5,796,309 A * | 8/1998  | Nguyen | .................. | 330/289 |
| 5,832,373 A * | 11/1998 | Nakanishi et al. | .................. | 455/126 |
| 5,898,340 A * | 4/1999  | Chatterjee et al. | .................. | 330/251 |
| 5,943,246 A * | 8/1999  | Porter | .................. | 700/293 |
| 6,121,907 A * | 9/2000  | Fields et al. | .................. | 341/137 |
| 6,377,196 B1* | 4/2002  | Kolsrud et al. | .................. | 341/118 |
| 6,842,478 B1* | 1/2005  | Ogino | .................. | 375/147 |
| 7,253,763 B2* | 8/2007  | Garlapati et al. | .................. | 341/155 |
| RE40,031 E  * | 1/2008  | Goos | .................. | 455/127.1 |
| 7,324,036 B2* | 1/2008  | Petre et al. | .................. | 341/155 |
| 2002/0025789 A1* | 2/2002 | Hayashihara | .................. | 455/115 |
| 2002/0105317 A1* | 8/2002 | Lin | .................. | 324/103 P |
| 2003/0157964 A1* | 8/2003 | Park et al. | .................. | 455/558 |
| 2005/0084037 A1* | 4/2005 | Liang | .................. | 375/316 |
| 2005/0176392 A1  | 8/2005 | Ruitenburg et al. | | |
| 2007/0001889 A1* | 1/2007 | Garlapati et al. | | |

* cited by examiner

*Primary Examiner*—Linh V Nguyen
(74) *Attorney, Agent, or Firm*—Thomas, Kayden, Horstemeyer & Risley

(57) ABSTRACT

A power-to-digital converter (PDC) converting a signal power to digital code. The PDC comprises a power detector, an analog-to-digital converter (ADC), and a timing and logic control circuit. The power detector receives the signal power and generates a DC output and a first determined number of bits. The ADC is coupled to the power detector and receives and converts the DC output to a second determined number of bits. The timing control logic circuit is coupled to the power detector and the ADC and sequentially enables the power detector and the ADC. The first and second predetermined numbers of bits are respectively most significant bits (MSBs) and least significant bits (LSBs) of the digital code. The bit resolution of the digital code is the sum of the first and second numbers.

10 Claims, 11 Drawing Sheets

POWER-TO-DIGITAL CONVERTER

BACKGROUND OF THE INVENTION

1. Field of the Invention

The invention relates to a power-to-digital converter (PDC) and, in particular, to a small area PDC with high resolution.

2. Description of the Related Art

Power-to-digital converters (PDC) are often used in radio frequency (RF) communication systems. FIG. 1 is a block diagram of a conventional power-to-digital converter. The power-to-digital converter 100 receives and converts a signal power to digital codes. The power-to-digital converter 100 comprises a power detector 110 and an analog-to-digital converter (ADC) 120 coupled thereto. The power detector 110 receives the signal power and provides a DC output signal to the analog-to-digital converter 120. The analog-to-digital converter 120 converts the DC output signal of the power detector 110 to the digital codes. In such architecture, if the analog-to-digital converter 120 is an M-bit ADC, then the digital code has a resolution of M bits. In other words, an average resolution of the conventional power-to-digital converter is determined by a dynamic range (DR) of the power detector 110 and the bit resolution of the analog-to-digital converter 120, which is expressed as $DR/2^M$. For example, a power detector with a dynamic range of 80 dBc and an 8-bit ADC is used in the conventional PDC. The PDC possesses $2^8$ (256) available codes and an average resolution thereof is $80/2^8 (=0.31)$.

FIG. 2 is a schematic diagram of a conventional power detector in the conventional power-to-digital converter in FIG. 1. The power detector 200 comprises a plurality of amplifiers 210, a plurality of rectifiers 220, and a lower pass filter 230. Each rectifier 220 is coupled between an output of a respective amplifier 210 and the low pass filter 230. Since the power detector 200 requires a large number of amplifiers 210 and rectifiers 220, the power detector 200 occupies large area. In addition, a successive approximation (SAR) analog-to-digital converter (ADC) in the PDC having the power detector 200 in FIG. 2 covers all bit resolution required thereby. The SAR ADC requires a large number of resistors and capacitors. As a result, the resistor and capacitor arrays also occupy a large area. Accordingly, the conventional power-to-digital converter consumes a large silicon area due to a large power detector and a large SAR ADC.

BRIEF SUMMARY OF THE INVENTION

An embodiment of a power-to-digital converter (PDC) comprises a power detector, an analog-to-digital converter (ADC), a timing control logic circuit. The PDC converts a signal power to digital code. The power detector receives the signal power and generates a DC output and a first determined number of bits. The ADC is coupled to the power detector and receives and converts the DC output to a second determined number of bits. The timing and logic control circuit is coupled to the power detector and the ADC and sequentially enables the power detector and the ADC. The first and second predetermined numbers of bits are respectively most significant bits (MSBs) and least significant bits (LSBs) of the digital code.

The invention provides a power-to-digital converter (PDC) converting a signal power to digital code. The power detector in the PDC extracts the most significant bits of the digital code. Thus, the ADC in the PDC does not need high resolution. Accordingly, the PDC of the invention occupies minimal space or provides higher resolution occupying the same space as a conventional PDC.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
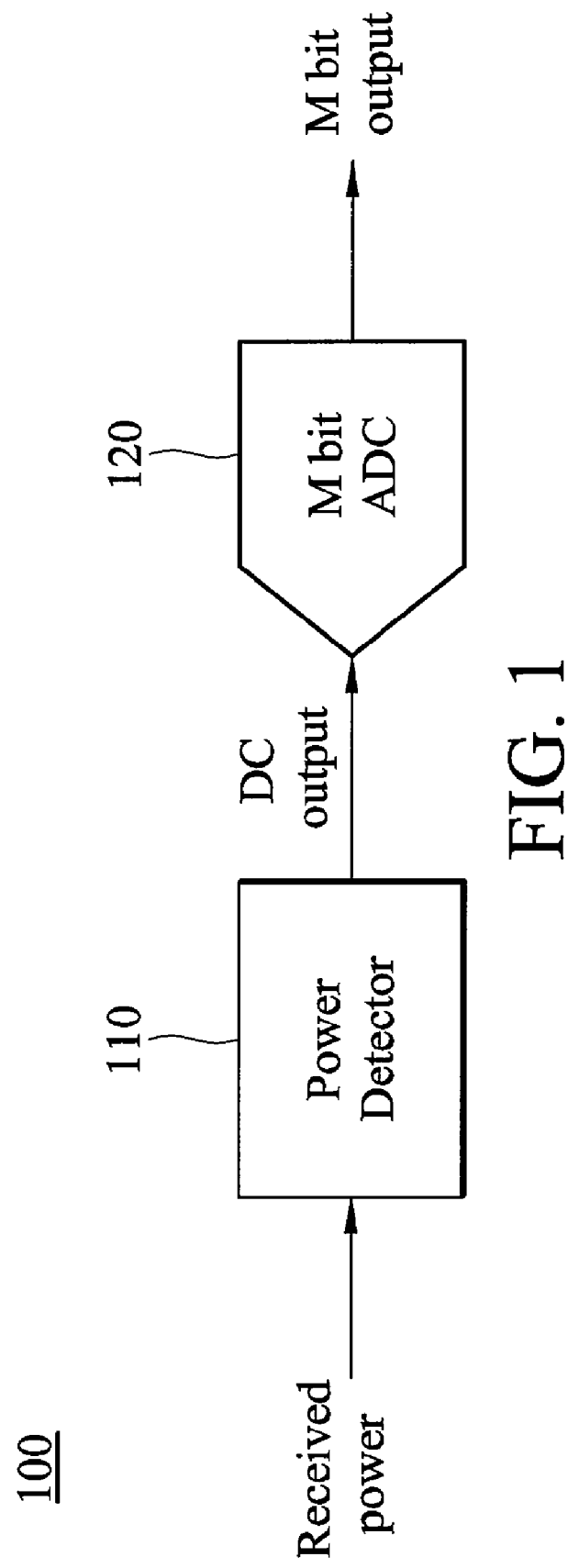
FIG. 1 is a block diagram of a conventional power-to-digital converter.
Figure 2:
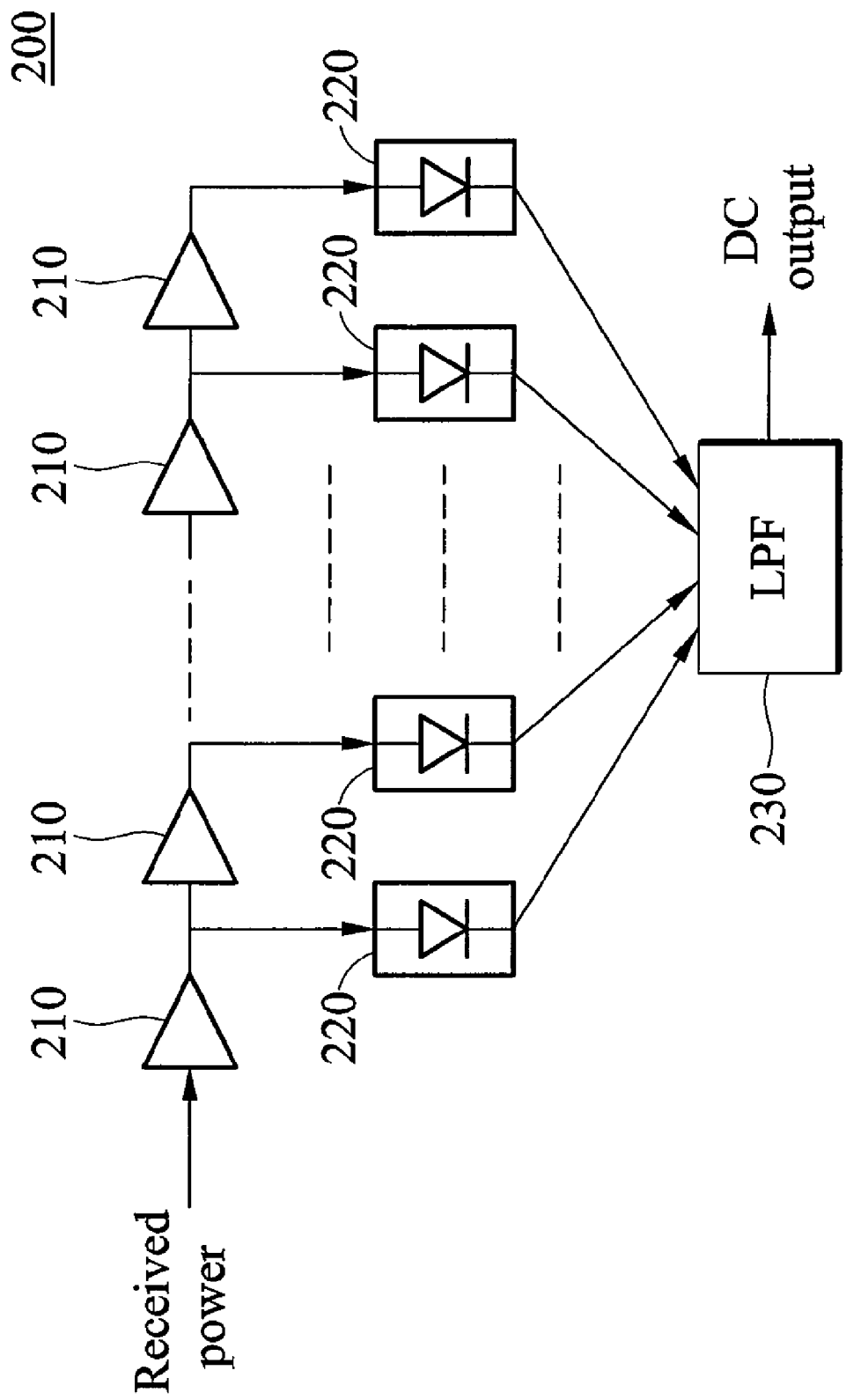
FIG. 2 is a schematic diagram of a conventional power detector in the conventional power-to-digital converter in FIG. 1.
Figure 3:
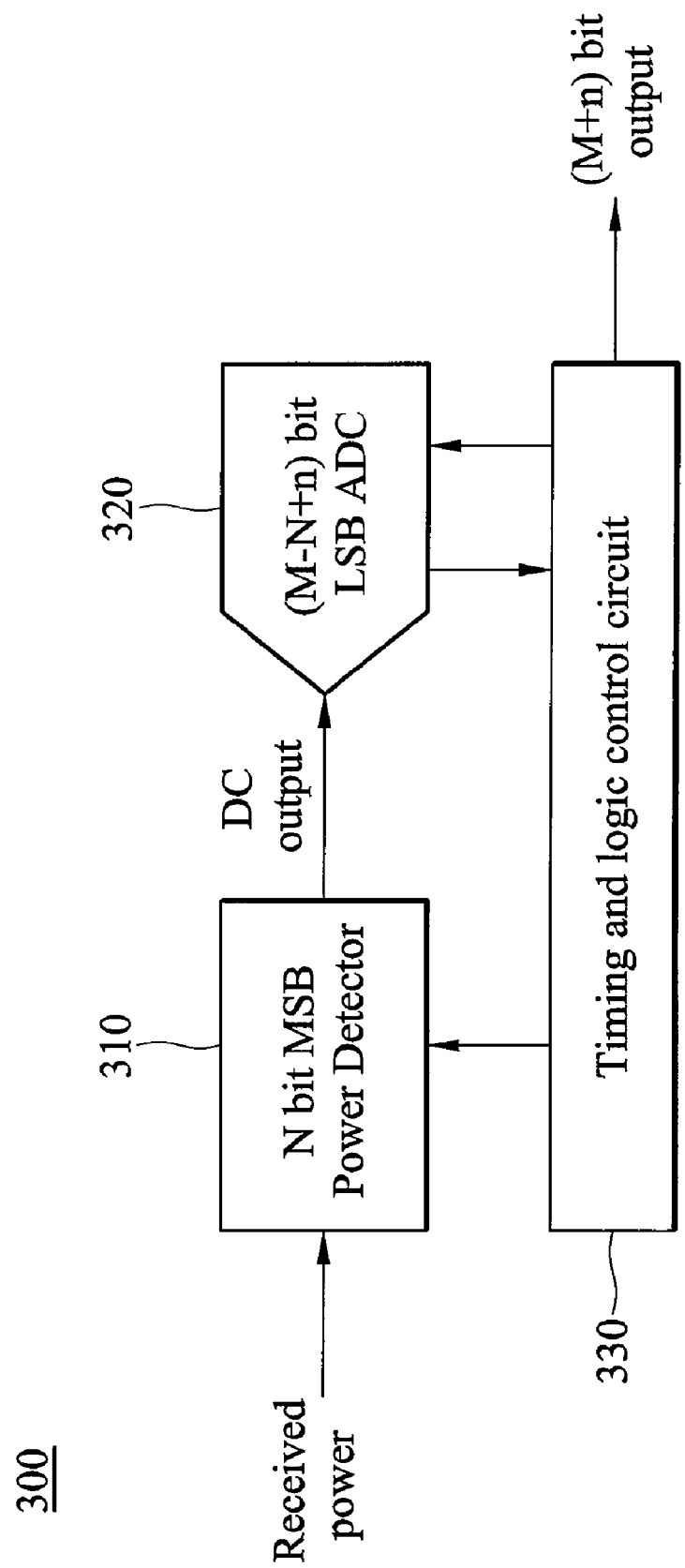
FIG. 3 is a block diagram of a power-to-digital converter according to an embodiment of the invention.

FIG. 3 is a block diagram of a power-to-digital converter according to an embodiment of the invention. The power-to-digital converter 300 receives and converts a signal power to digital codes. The power-to-digital converter 300 comprises a power detector 310, an analog-to-digital converter 320, and a timing control logic circuit 330. The power detector 310 receives a signal power and provides a DC output to the analog-to-digital converter 320. The power detector 310 also converts the signal power to a code of N bits. The analog-to-digital converter 320 receives and converts the DC output of the power detector 310 to a code of (M-N+n) bits. The timing control logic circuit 330 is coupled to the power detector 310 and the analog-to-digital converter 320. The timing control logic circuit 330 sequentially enables the power detector 310 and the analog-to-digital converter 320 and receives the N-bit code and the (M-N+n)-bit code therefrom. The timing controller 330 respectively converts the N-bit code and the (M-N+n)-bit code to most significant bits (MSBs) and least significant bits (LSBs) of the digital code.

Figure 4:
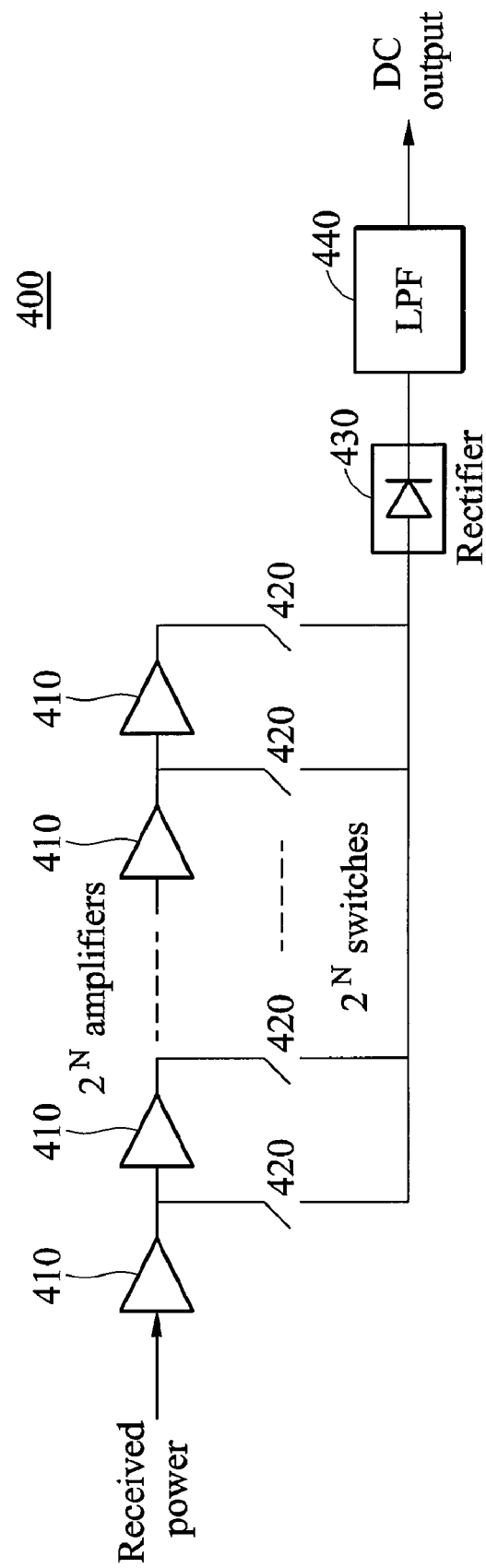
FIG. 4 is a schematic diagram of an N-bit power detector according to an embodiment of the invention.

FIG. 4 is a schematic diagram of an N-bit power detector according to an embodiment of the invention. The N-bit power detector 400 comprises a plurality of amplifiers 410 connected in series, a plurality of switches 420, a rectifier 430, and a low pass filter 440. The first of the amplifiers 410 receives a signal power. Each of the switches 420 is connected between the output of a respective amplifier 410 and the rectifier 430. The low pass filter 440 is coupled to an output of the rectifier 430. More specifically, there are $2^N$ amplifiers connected in series and $2^N$ switches each connected between the output of a respective amplifier 410 and the rectifier 430.

Figure 5A:
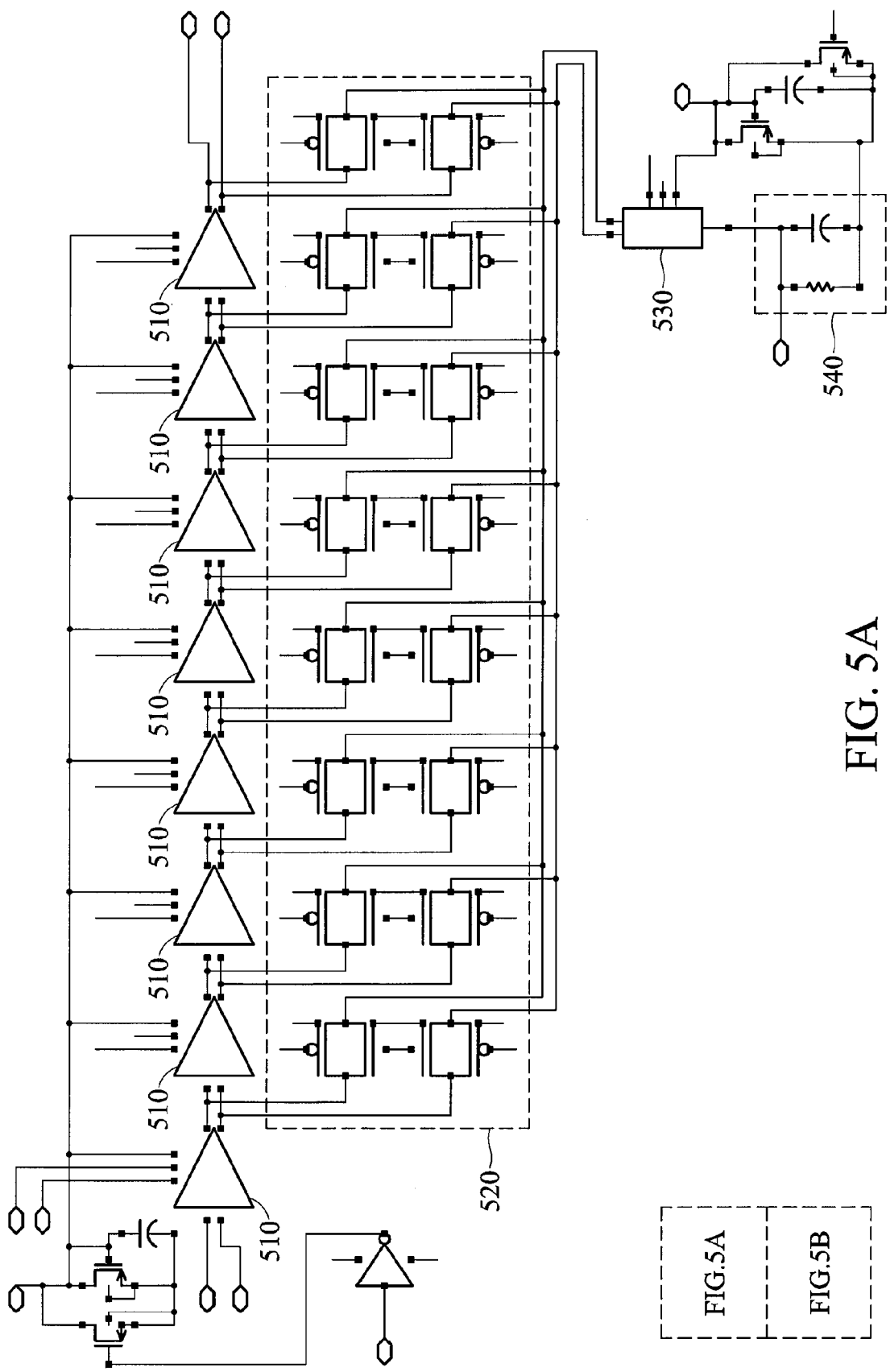
FIGS. 5A and 5B is a schematic diagram of a power-to-digital converter according to an embodiment of the invention.
Figure 5B:
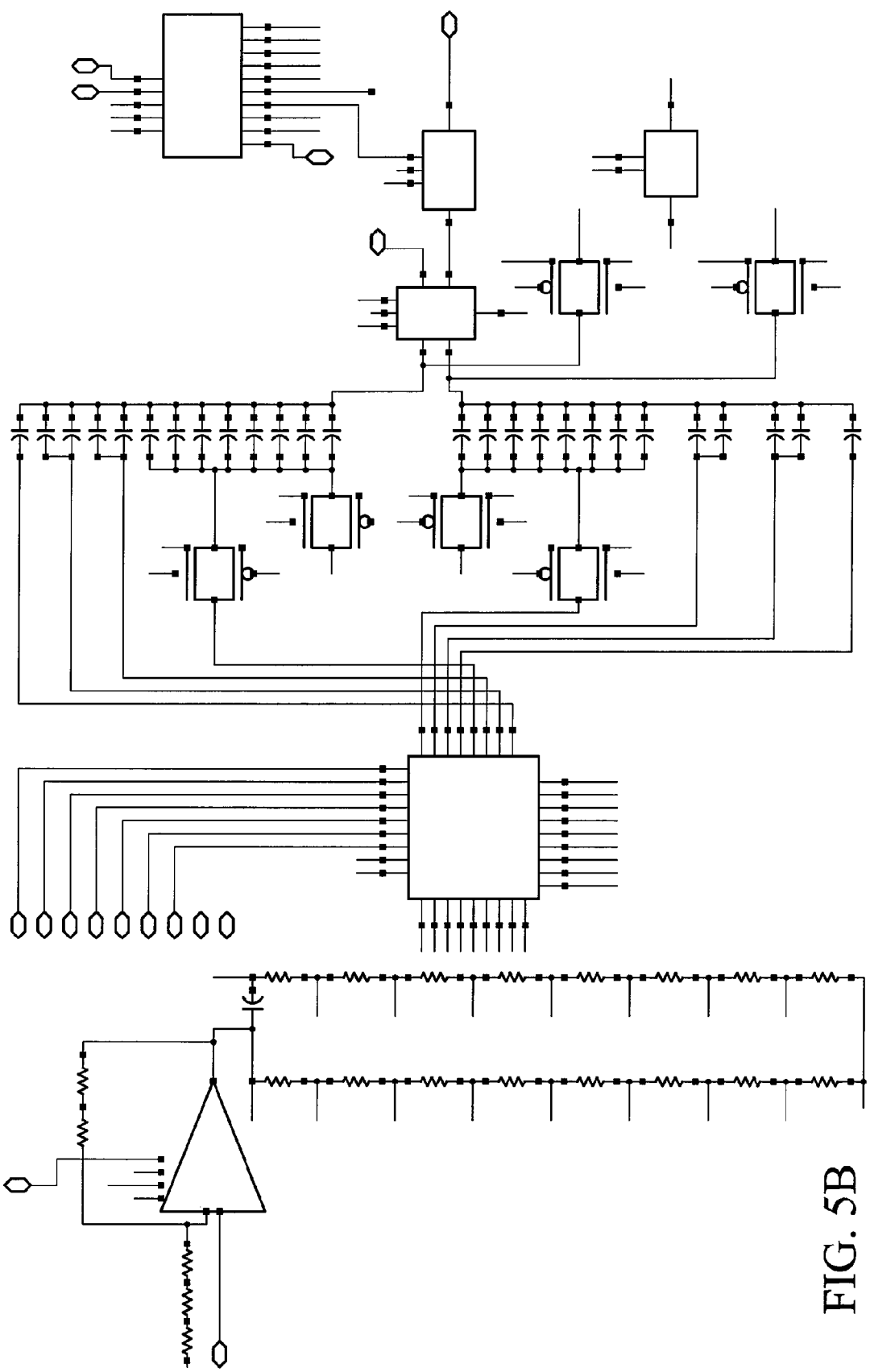
Figure 6A:
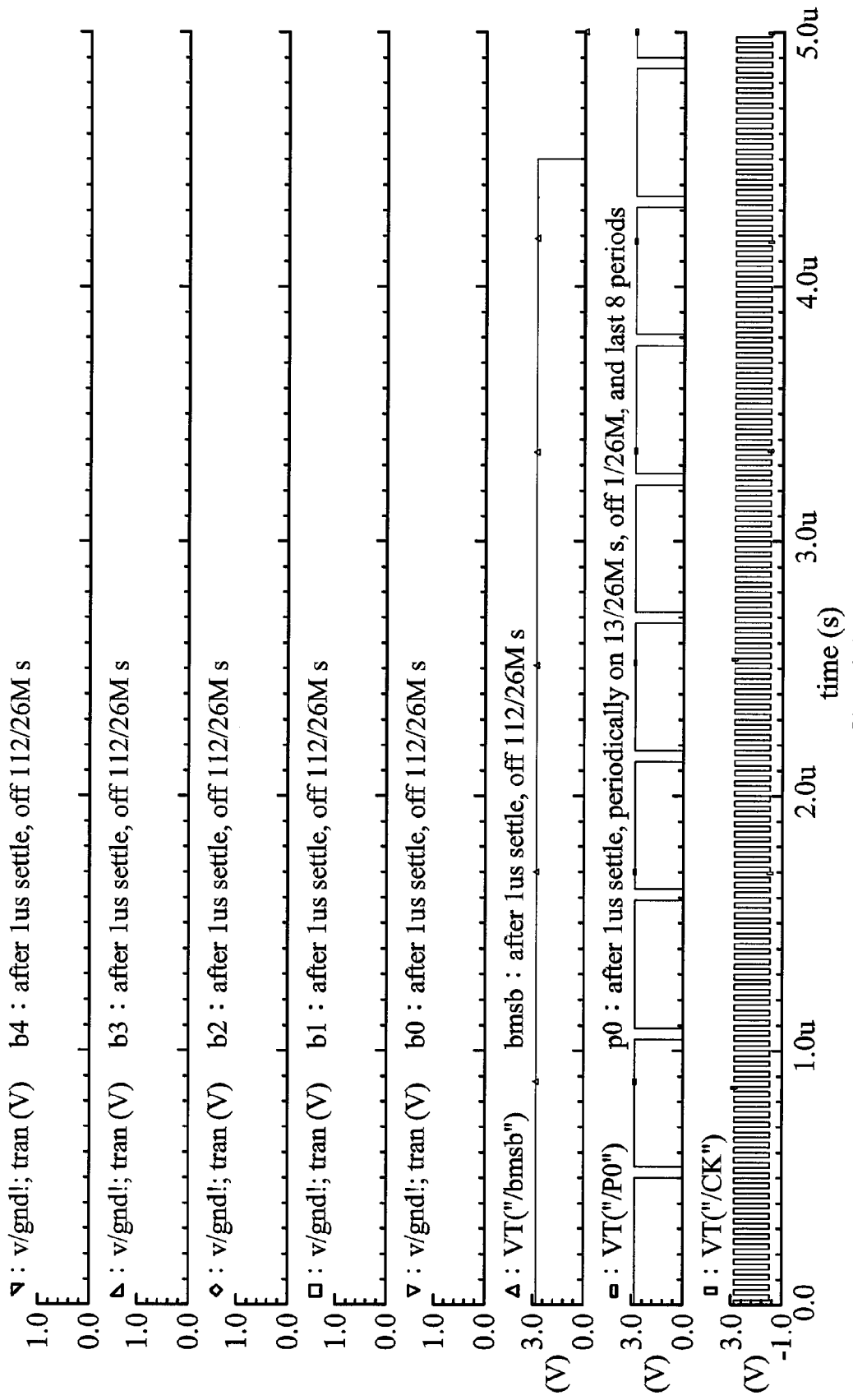
FIGS. 6A and 6B is a diagram showing waveforms of required control signals during operation of the power detector in FIGS. 5A and 5B.
Figure 6B:
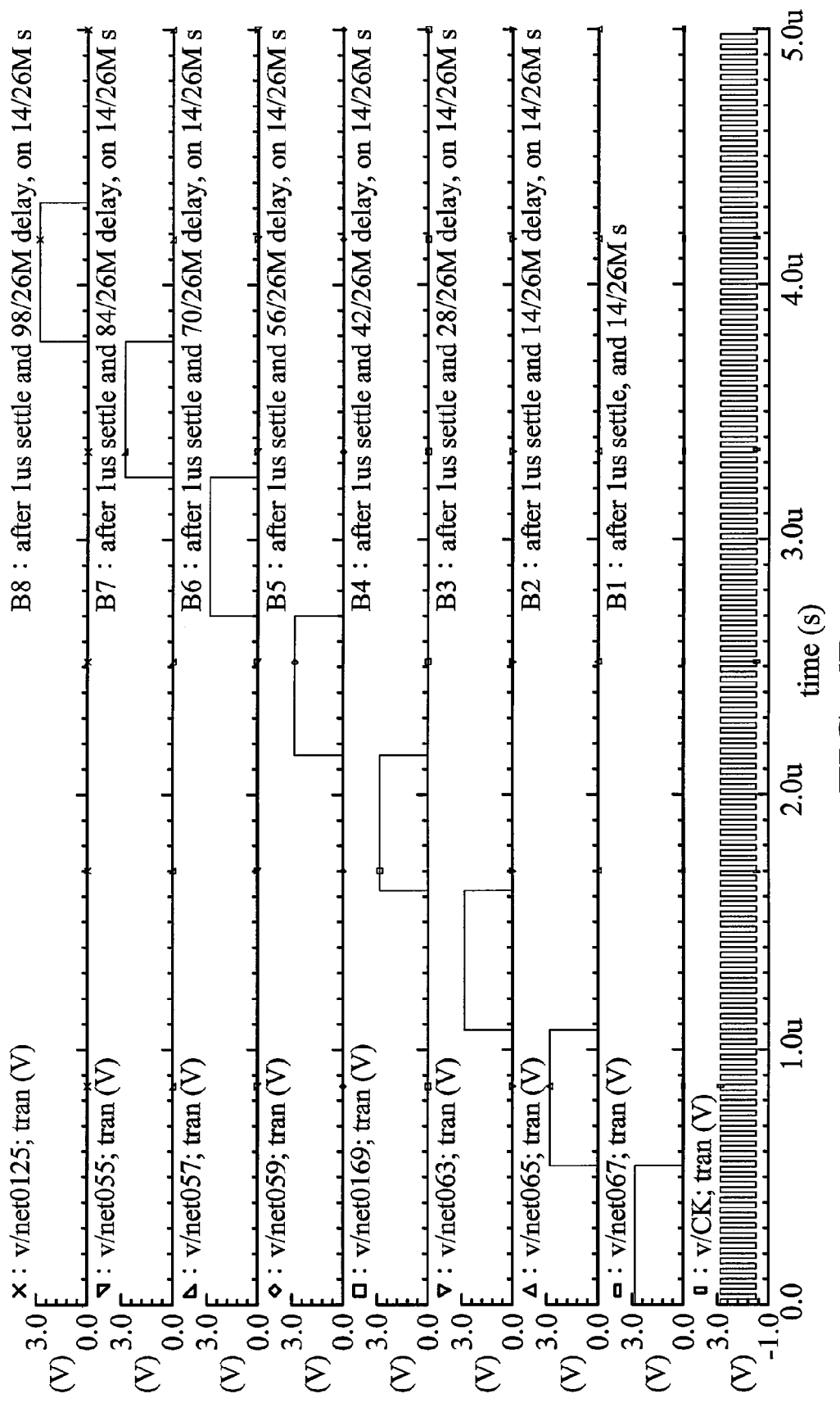
Figure 7:
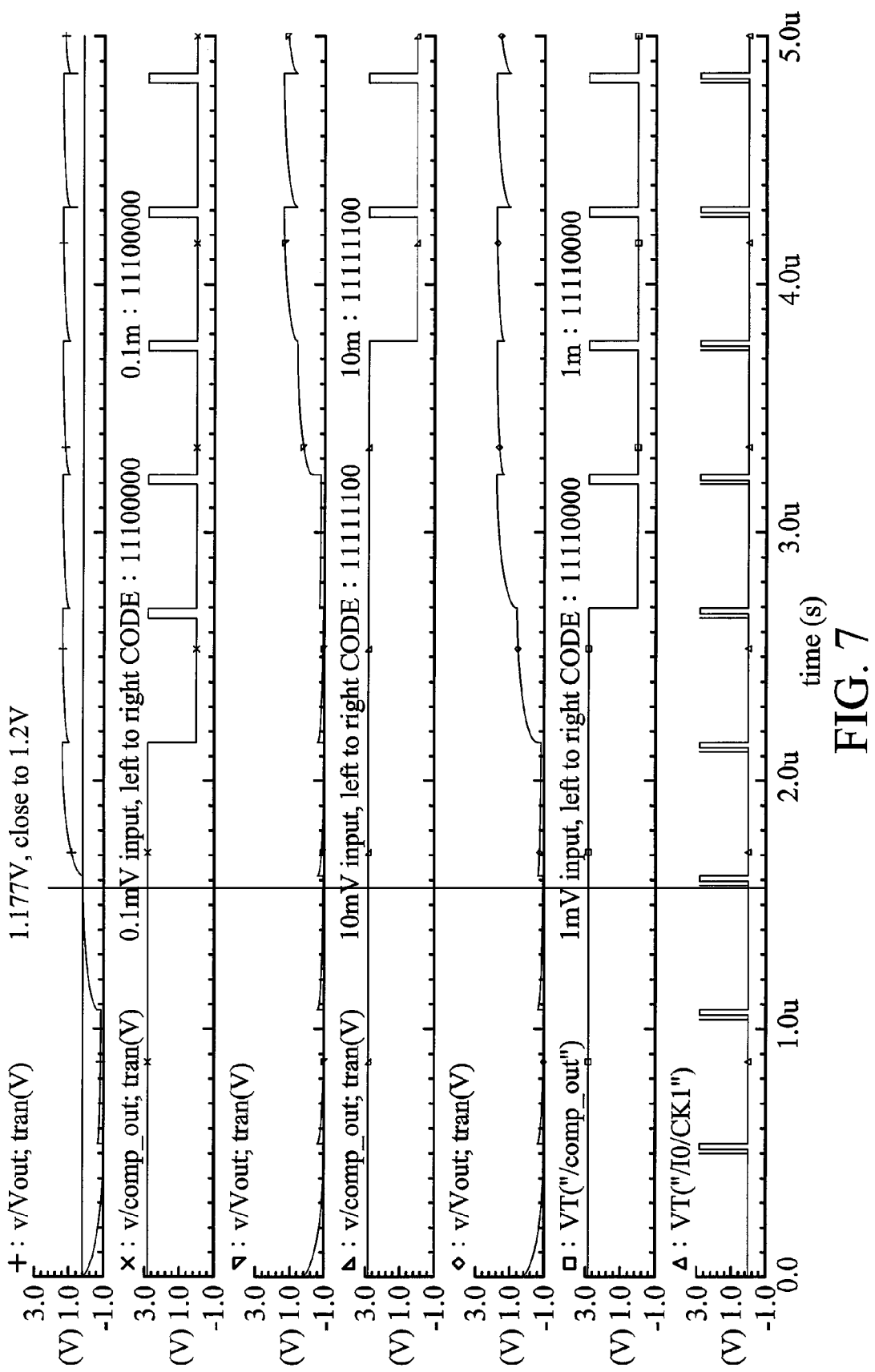
FIG. 7 is a diagram showing waveforms of the DC output of the power detector and a 3-bit code corresponding thereto.
Figure 8:
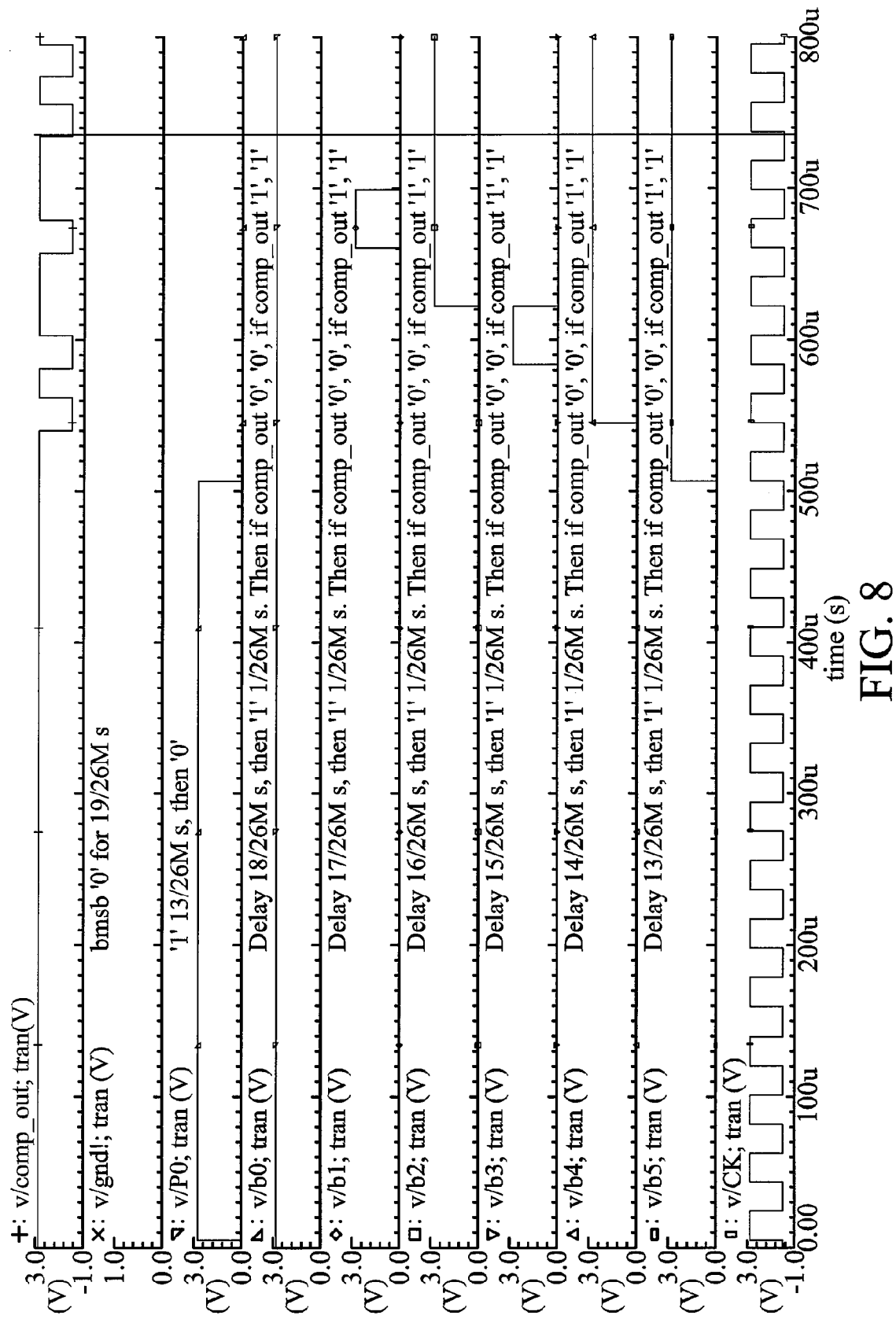
FIG. 8 is a diagram showing waveforms of required control signals during operation of the power detector in 5A and 5B.

FIGS. 5A and 5B is a schematic diagram of a power-to-digital converter according to an embodiment of the invention. The detailed construction of the 3-bit power detector according to that in FIG. 4 is shown in FIGS. 5A and 5B. In FIG. 5A, 8 differential amplifiers 510 are connected in series. Transmission gates 520 are used as switches and coupled between the output of a respective amplifier 510 and a rectifier 530. A low pass filter 540 is coupled to an output of the rectifier 530 and generates a DC output V_out. FIGS. 6A and 6B is a diagram showing waveforms of required control signals during operation of the power detector in FIGS. 5A and 5B. During signal conversion of the power detector, the control signal bmsb is at a high state to start operation of the power detector. A control signal PO is used to sample the DC output V_out from the power detector. The control signals B1~B8 control switching of the transmission gates. The signal conversion of the power detector is divided into 8 phases. In each phase, only a pair of transmission gates is turned on such that a differential output signal of a respective amplifier is passed to the rectifier. The switches (the transmission gates) are turned on one by one sequentially. In addition, the control signals b0~b5 of the analog-to-digital converter are at a low state during operation of the power detector. FIG. 7 is a diagram showing waveforms of the DC output of the power detector and a 3-bit code corresponding thereto. In FIG. 7, an input signal of 0.1 mV results in a 3-bit code: 111100000. An input signal of 10 mV results in a 3-bit code: 11111100 and an input signal of 1 mV results in a 3-bit code: 11110000.

A detailed construction of a 6-bit SAR ADC is shown in FIG. 5B. The 6-bit SAR ADC comprises a 3-bit resistor string and a 3-bit capacitor array. FIG. 8 is a diagram showing waveforms of required control signals during operation of the analog-to-digital converter in FIGS. 5A and 5B. After operation of the power detector, the control signal bmsb is pulled to a low state. The signal PO is pulled low in a short time and the 6-bit SAR ADC starts signal conversion. In addition, the control signals b5 to b0 of the SAR ADC are sequentially pulled high such that a binary search is performed therein. The signal comp_out represents a digital output of the SAR ADC.

Figure 9:
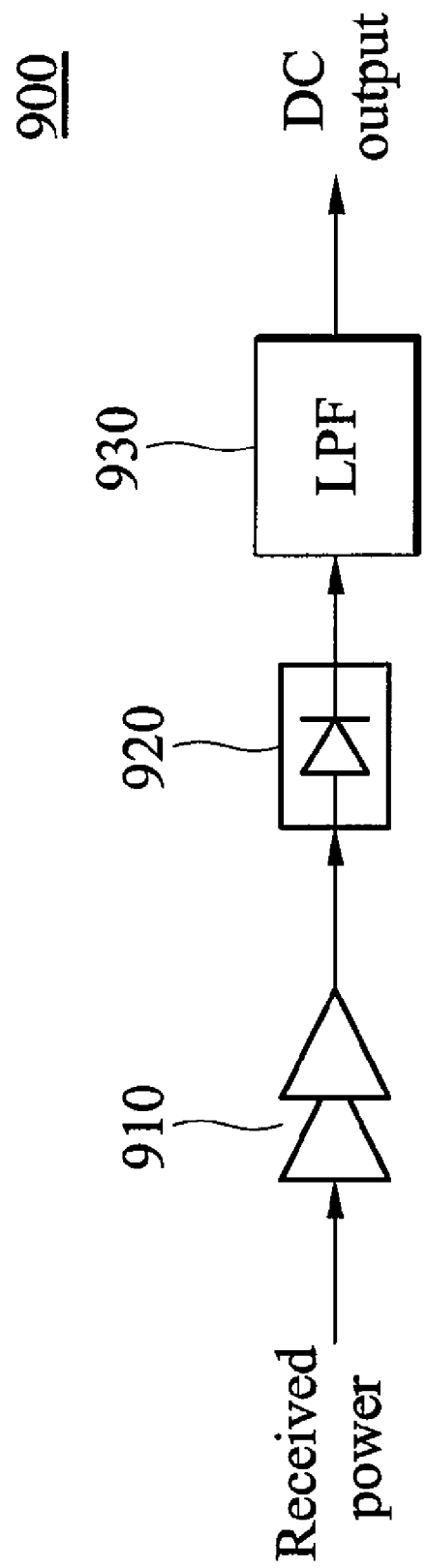
FIG. 9 is a schematic diagram of an N-bit power detector according to another embodiment of the invention.

FIG. 9 is a schematic diagram of an N-bit power detector according to another embodiment of the invention. The N-bit power detector 400 comprises a variable gain amplifier (VGA) 910, a rectifier 920, and a low pass filter 930. A variable gain amplifier 910 receives a signal power. The rectifier is coupled to an output of the VGA 910. The low pass filter 930 is coupled to an output of the rectifier 920 and generates a DC output. The N-bit power detector in FIG. 9 can be used as the N-bit power detector 310 in FIG. 3 and results in a power-to-digital converter with a small area.

The invention provides a power-to-digital converter (PDC) converting a signal power to digital code. The power detector in the PDC extracts the most significant bits of the digital code. Thus, the ADC in the PDC does not need a high resolution. Accordingly, the PDC of the invention occupies minimal space or provides higher resolution occupying the same space as a conventional PDC.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A power-to-digital converter converting a signal power to a digital code, comprising:
   a power detector receiving the signal power and generating a DC output corresponding to a first predetermined number of bits;
   an analog-to-digital converter (ADC), coupled to the power detector, receiving and converting the DC output to a second determined number of bits; and
   a timing and logic control circuit coupled to the power detector and the ADC, for controlling the power detector and the ADC;
   wherein the first and second predetermined numbers of bits are respectively most significant bits (MSBs) and least significant bits (LSBs) of the digital code and a bit resolution thereof is a sum of the first and second predetermined numbers.

2. The power-to-digital converter as claimed in claim 1, wherein the power detector comprises a plurality of amplifiers connected in series, a rectifier, a plurality of switches each coupled between the output of each amplifier and the input of the rectifier, and a low pass filter coupled to an output of the rectifier and generating the DC output.

3. The power-to-digital converter as claimed in claim 2, wherein the numbers of the amplifiers and the switches are both two to the power of the first predetermined number.

4. The power-to-digital converter as claimed in claim 3, wherein the switches are sequentially turned on one by one.

5. The power-to-digital converter as claimed in claim 3, wherein the amplifiers are differential amplifiers.

6. The power-to-digital converter as claimed in claim 3, wherein the switches are transmission gates.

7. The power-to-digital converter as claimed in claim 1, wherein the power detector comprises a variable gain amplifier (VGA) receiving the signal power, a rectifier coupled to an output of the VGA, and a low pass filter coupled to an output of the rectifier and generating the DC output.

8. The power-to-digital converter as claimed in claim 7, wherein a variable gain of the VGA has two to the power of the first predetermined number levels.

9. The power-to-digital converter as claimed in claim 1, wherein the ADC is a successive approximation register (SAR) ADC.

10. The power-to-digital converter as claimed in claim 2, wherein the switches are successive approximation registers (SAR).

* * * * *